United States Patent
Aikala et al.

(10) Patent No.: US 10,655,838 B1
(45) Date of Patent: May 19, 2020

(54) LIGHTING ELEMENT AND A METHOD FOR MANUFACTURING A LIGHTING ELEMENT

(71) Applicant: Valoya Oy, Helsinki (FI)

(72) Inventors: Lars Aikala, Lapinkylä (FI); Kari Kylä-Kaila, Raisio (FI)

(73) Assignee: VALOYA OY, Helsinki (FI)

(*) Notice: Subject to any disclaimer, the term of this patent is extended or adjusted under 35 U.S.C. 154(b) by 0 days.

(21) Appl. No.: 16/288,635

(22) Filed: Feb. 28, 2019

(51) Int. Cl.
| | |
|---|---|
| *F21V 31/00* | (2006.01) |
| *H05K 1/03* | (2006.01) |
| *F21V 23/06* | (2006.01) |
| *A01G 7/04* | (2006.01) |
| *A01G 9/20* | (2006.01) |
| *F21Y 113/13* | (2016.01) |
| *F21Y 115/10* | (2016.01) |

(52) U.S. Cl.
CPC ............ *F21V 31/005* (2013.01); *A01G 7/045* (2013.01); *A01G 9/20* (2013.01); *F21V 23/06* (2013.01); *H05K 1/0306* (2013.01); *F21Y 2113/13* (2016.08); *F21Y 2115/10* (2016.08); *H05K 2201/10106* (2013.01)

(58) Field of Classification Search
CPC ...... F21V 31/005; F21V 23/06; H05K 1/0306; H05K 2201/10106; A01G 9/20; A01G 7/045; F21Y 2115/10; F21Y 2113/13
See application file for complete search history.

(56) References Cited

U.S. PATENT DOCUMENTS

| | | | |
|---|---|---|---|
| 2007/0223218 A1* | 9/2007 | You | F21S 8/031 362/231 |
| 2015/0128409 A1* | 5/2015 | Chen | F21V 31/04 29/829 |
| 2017/0114993 A1* | 4/2017 | Kim | F21V 29/80 |
| 2018/0132429 A1* | 5/2018 | Wu | A01G 9/20 |
| 2019/0032898 A1* | 1/2019 | Chen | F21V 5/007 |

* cited by examiner

*Primary Examiner* — Anh T Mai
*Assistant Examiner* — Glenn D Zimmerman
(74) *Attorney, Agent, or Firm* — Young & Thompson

(57) ABSTRACT

The invention relates to a waterproof lighting element, wherein the lighting element comprises a printed circuit board with an aluminum substrate layer. The invention relates also to a waterproof lighting element, wherein the lighting element comprises a printed circuit board with a base plate. The invention relates also to a method of manufacturing a waterproof lighting element.

6 Claims, 2 Drawing Sheets

US 10,655,838 B1

LIGHTING ELEMENT AND A METHOD FOR MANUFACTURING A LIGHTING ELEMENT

FIELD OF THE INVENTION

The present disclosure relates to lighting elements, and particularly to waterproof LED lighting elements for production of plants.

BACKGROUND OF THE INVENTION

Artificial lighting based on solid state devices, such as light emitting diodes (LEDs), is used in production of plants as a substitute for natural light or as a supplement to natural light to promote plant growth. LED luminaires are well suited for this purpose as they provide light of the desired wavelength. Also, the LED components do not heat up in the same way as conventional lamps, so they can be placed very close to the plant.

Such luminaires usually have one or more light emitting diodes mounted in an enclosure assembly having a transparent portion covering the LEDs so that the light emitted by LEDs can radiate through the transparent portion towards the plants. However, although designed to be used in production of plants, under humid and wet conditions, such as greenhouses, the enclosure assemblies are often relatively open in such way that their protective capabilities for the underlying electrical parts are not very high or the mechanical solution to reach high humidity protection becomes costly in components and/or to manufacture. In some cases, the tightness of the transparent portions is often even inadequate whereby water and dirt can get inside the luminaires.

Secondly, even if horticultural LED luminaires have long use-lives, reaching up to 40 000 hours, with only small decay, they too experience decay. The light decay is a result of the LED output being lowered over time. In order to continue benefitting of the non-decaying parts, like the aluminum heatsink, cabling and possibly electrical connectors and to benefit from the parts decaying slower than the LEDs, like power units, the user would benefit from the possibility of exchanging the LED portion of the LED luminaire at an cost, lower than acquiring a new LED luminaire with power units etc. This is not currently possible, as there are no suitable technical solutions available.

SUMMARY OF THE INVENTION

An object of the present disclosure is to provide a lighting element and a method related to it to alleviate the above disadvantages.

The object of the disclosure is achieved by a lighting element and a method for manufacturing a lighting element which is characterized by what is stated in the independent claims. The preferred embodiments of the disclosure are disclosed in the dependent claims.

This is achieved by a lighting element which comprises a printed circuit board with a metal substrate layer, made of aluminum or copper, having a first side and an opposite second side. The first side has a centre section and a peripheral section, of which the centre section has a trace layer and the peripheral section forms a closed loop shape without the trace layer around the centre section. On a second side of the printed circuit board there is a bare aluminum surface of the substrate layer. The lighting element of the embodiment further comprises a plurality light emitting diode components, mounted on the surface of the centre section of the first side having a trace layer. In the lighting element there is a transparent cover element, preferably made of tempered glass, which is arranged to cover the first side of the printed circuit board and the LED components mounted on it. The transparent cover element is mounted on top of the first side, the cover element having a contact surface facing the peripheral section of the first side. An adhesive sealant is arranged between the peripheral section and the contact surface, wherein the adhesive sealant forms a closed loop shape attaching the printed circuit board and the cover element together, thereby forming a waterproof structure sealing the LED components inside the waterproof structure.

The invention is based on the idea for providing a replaceable, low-cost, lighting element, which is waterproof and dust-proof, and allows its installation for various lighting purposes in production of plants. The lighting element is designed to be easily installable and may also be used for retrofitting of existing luminaires, thus facilitating the maintenance of LED based luminaires. Thanks to the improved water resistance and dust resistance achieved by the invention, the need for separate protection solutions is eliminated.

BRIEF DESCRIPTION OF THE DRAWINGS

Examples of the invention will now be described in detail with reference to the accompanying drawings, in which:

FIG. 1 B presents a side view of a printed circuit board assembly of a lighting element;

DETAILED DESCRIPTION OF THE EMBODIMENTS

Figure 1:
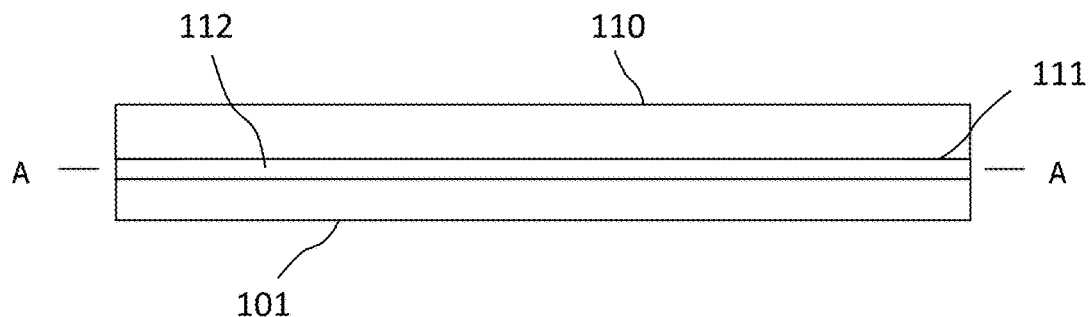
FIG. 1 A presents a side view of a lighting element according to a first embodiment of the invention.
Figure 1:
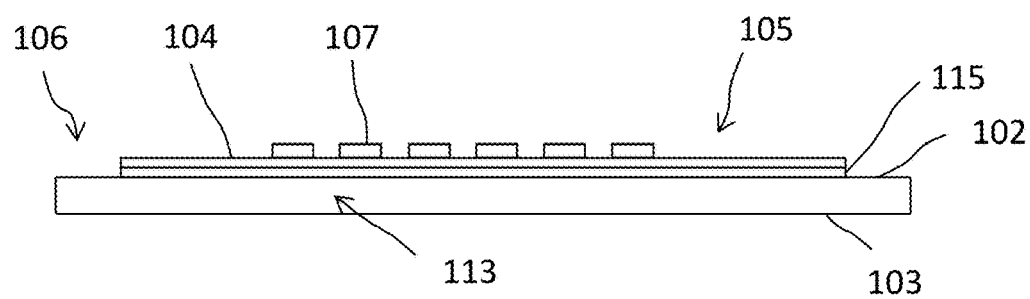

FIG. 1 A presents a side view of a lighting element according to the first embodiment of the invention. FIG. 1 B presents a side view of a printed circuit board assembly of a lighting element shown in FIG. 1 A. The lighting element 100 comprises a printed circuit board (PCB) 101 with a metal substrate layer 113, made of aluminium or copper, having a first side 102 and an opposite second side 103. The first side 102 has a centre section 105 and a peripheral section 106, of which the centre section 105 has a trace layer 104 and the peripheral section 106 forms a closed loop shape without the trace layer around the centre section 105. On a second side 103 of the printed circuit board 101 there is a bare aluminum surface of the substrate layer 113. The trace layer 104 of the first side is preferably a printed circuit layer foil having thicknesses in the range of 20-450 µm, whereas the thicknesses of the substrate layer may be in the range of 0.8-3.2 mm, for example 1.6 mm. Below the trace layer 104 of the first side 102, there is a dielectric layer 115 made of a dielectric foil material electrically insulating the aluminum substrate layer 113 from the trace layer 104 and enabling heat transfer between the trace layer 104 and the substrate layer 113. In the embodiment, the trace layer 104 is bonded to the dielectric layer 115 and the dielectric layer 115 is bonded to the to the aluminum substrate layer 113.

The waterproof lighting element 100 of the first embodiment further comprises a plurality light emitting diode (LED) components 107 mounted on the surface of the centre section of the first side having a trace layer 104, in which at least two subsets of LED components with different emission spectrums may be used. The emission spectrums of the subsets can be appropriately combined and the amount of each color in the spectra can then be fine-tuned to the specific needs of different plants and their growth phases.

In the lighting element 100 there is a transparent cover element 110, preferably made of tempered glass, which is arranged to cover the first side of the printed circuit board 101 and the LED components 107 mounted on it. When viewed from the side, the cross section of the cover element may be U-shaped or rectangular, but its shape is not limited to these shapes but may vary. The transparent cover element 110 is mounted on top of the first side 102, the cover element having a contact surface 111 facing the peripheral section 106 of the first side 102. An adhesive sealant 112 is arranged between the peripheral section 106 and the contact surface 111, wherein the adhesive sealant 112 forms a closed loop shape attaching the printed circuit board 101 and the cover element 110 together, thereby forming a waterproof structure sealing the LED components 107 inside the waterproof structure. As an adhesive sealant, silicone-based materials, glue or other adhesive can be used.

Figure 2:
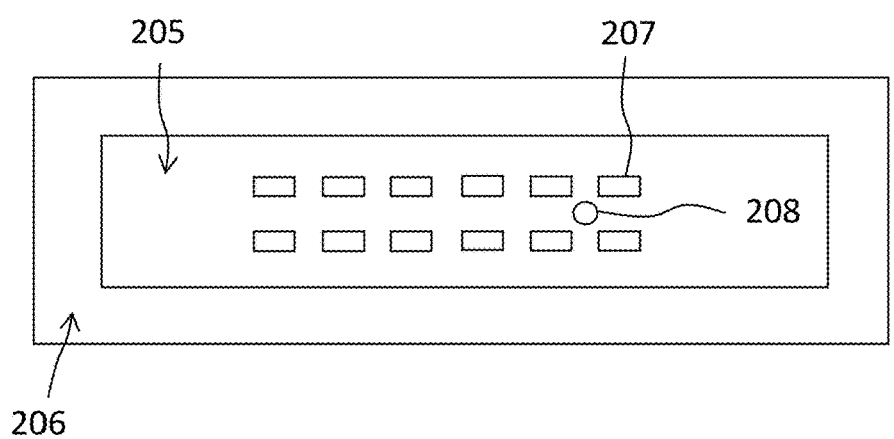
FIG. 2 presents a top view of a printed circuit board assembly of a lighting element.

FIG. 2 presents a top view of a printed circuit board assembly of a waterproof lighting element. Referring to FIG. 2, the printed circuit board 201 is provided with an opening 208 extending through the printed circuit board 201 from the first side to the opposite second side. A waterproof electrical connector (not shown in FIG. 2) is mounted through the opening 208, wherein the waterproof connector is configured to provide a connection interface on the second side in order to form an electrical connection to the LED components 207 and to supply electrical power safely to the lighting element.

Figure 3:
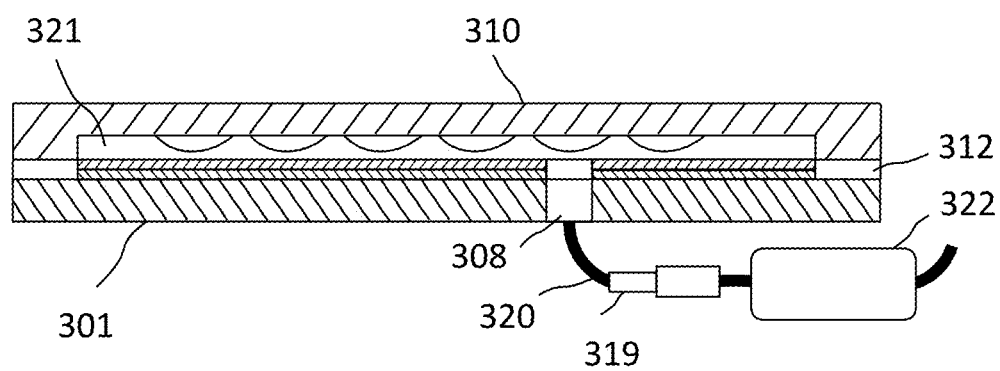
FIG. 3 presents a cross-sectional side view of a lighting element with a reflector.

FIG. 3 presents a cross-sectional side view of a waterproof lighting element in accordance with line A-A shown in FIG. 1 A. Referring to FIG. 3, the waterproof lighting element 300 comprises a printed circuit board 301, a plurality of LED components mounted on it (not shown), a transparent cover element 310 and an adhesive sealant 312 arranged between the printed circuit board 301 and the cover element 310. The waterproof lighting element 300 further comprises a reflector element 321, which may be optional, which reflector is attached to the transparent cover element 310. The reflector element 321 is arranged between the transparent cover element and a first side of a printed circuit board 301, allowing the reflector element 321 to shape and direct the light, if scattered, toward the plants to be grown.

The waterproof lighting element 300 may further comprise a waterproof electrical connector 319 mounted through the opening 308, wherein the waterproof connector 319 is configured to provide a connection interface on the second side of the printed circuit board in order to form an electrical connection to the LED components. The waterproof electrical connector or portion thereof may be mounted on the printed circuit board in various ways, for example by soldering. The waterproof electrical connector may be a quick-coupling structure which may comprise a male connector portion and a female connector portion, which are detachable from each other, in which both the male connector portion and the female connector portion are attached to the cable conductor 320. The waterproof lighting element 300 may further comprise a power source 322, such as a DC-DC or an AC-DC power converter, which may be mounted directly into the printed circuit board, or alternatively connected to the cable conductor 320, whereby the power converter may be an integral part or a separate part of the cable conductor.

Figure 4:
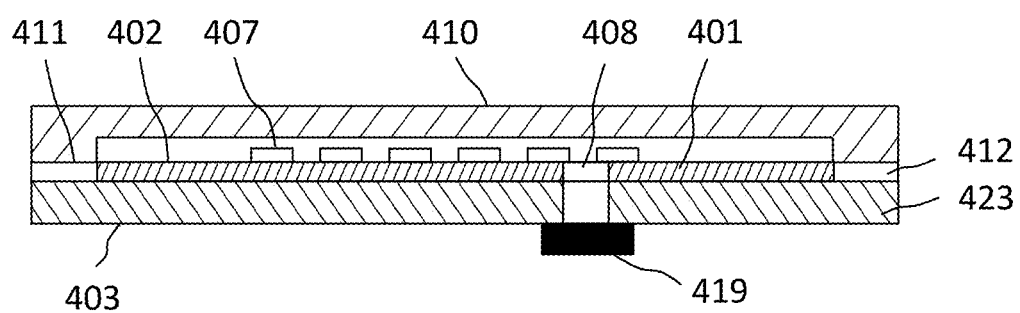
FIG. 4 presents a cross-sectional side view of a lighting element according to a second embodiment of the invention.

FIG. 4 presents a cross-sectional side view of a lighting element according to a second embodiment of the invention. In FIG. 4, there is presented a waterproof lighting element 400 comprising a base plate 423 made of aluminium, or alternatively of copper, wherein the base plate 423 has an opening 408 between a first side 402 and a second side 403 of the base plate, and a printed circuit board 401 mounted on the first side of the base plate 423, and wherein the printed circuit board 401 comprises a plurality of LED components 407. In the printed circuit board, there is a centre section of the first side where the printed circuit board 401 covers the base plate 423 and a peripheral section where the printed circuit board does not cover the first side. The peripheral section forms a closed loop shape around the centre section. The lighting element further comprises a waterproof electrical connector 419 mounted through the opening 408, wherein the waterproof connector 419 is configured to provide a connection interface on the second side of the base plate 423 in order to form an electrical connection to the LED components 407. Alternatively, the waterproof lighting element may comprise a similar waterproof connector as shown in FIG. 3. The lighting element 400 may also comprise a power source (not shown in FIG. 4).

In FIG. 4, in the waterproof lighting element 400 there is a transparent cover element 410 made of tempered glass, mounted on top of the first side of the base plate, the cover element having a contact surface 411 facing the peripheral section of the first side. Furthermore, there is an adhesive sealant 412 between the peripheral section and the contact surface, wherein the adhesive sealant forms a closed loop shape attaching the base plate 423 and the cover element 410 together, thereby forming a waterproof structure sealing the printed circuit board 401 and the LED components 407 inside the waterproof structure.

When comparing the first embodiment of the invention with the second embodiment of the invention, it is noted that in the second embodiment, the metallic base plate 423 and the printed circuit board 401 are separate parts, whereas in the first embodiment, the trace layer is attached to the metallic substrate layer. In the second embodiment, the base plate 423 and the PCB 401 can be disposed separately from each other. In this case, there can be optionally a suitable thermal interface material, such as thermal interface foil, thermal pad or thermal interface grease, arranged between the base plate 423 and the PCB 401 to provide a sufficient heat transfer between the PCB and the base plate.

The invention relates also to a method of manufacturing a waterproof lighting element, as discussed above. The method comprises steps of:

providing a printed circuit board blank having an aluminium substrate layer, wherein the printed circuit board further has a trace layer on a first side, removing a portion of the trace layer from the first side, thereby forming a centre section and a peripheral section on the first side, such that the centre section has the trace layer and that the peripheral section forms a closed loop shape without the trace layer around the centre section, forming an opening, the opening extending from the centre section of the first side of the printed circuit board to an opposite second side of the printed circuit board, mounting a plurality of LED components on the centre section, mounting a waterproof electrical connector through the opening, wherein the waterproof connector is configured to provide a connection interface on the second side in order to form an electrical connection to the LED components, providing an adhesive sealant on the peripheral section, wherein the adhesive sealant is configured to form a closed loop shape corresponding with the closed loop shape of the peripheral section, and mounting a transparent cover element made of tempered glass on the adhesive sealant on the first side so that the adhesive sealant attaches the cover element to the printed circuit board, thereby forming a waterproof structure sealing the LED components inside the waterproof structure.

It is obvious to a person skilled in the art that the inventive concept can be implemented in various ways. The invention and its embodiments are not limited to the examples described above but may vary within the scope of the claims.

The invention claimed is:

1. A waterproof lighting element comprising:
a printed circuit board with an aluminum substrate layer, the printed circuit board having a trace layer on a first side having a center section and a peripheral section, the center section having the trace layer, the peripheral section forming a closed loop shape without the trace layer around the center section, the printed circuit board having an opening extending from the first side to an opposite second side;
a plurality of light emitting diode (LED) components mounted on the center section of the first side;
a waterproof electrical connector mounted through the opening, the waterproof connector being configured to provide a connection interface on the second side in order to form an electrical connection to the LED components;
a transparent cover element made of tempered glass, mounted on top of the first side, the cover element having a contact surface facing the peripheral section of the first side; and
an adhesive sealant between the peripheral section and the contact surface, the adhesive sealant forming a closed loop shape attaching the printed circuit board and the cover element together, thereby forming a waterproof structure sealing the LED components inside the waterproof structure.

2. The waterproof lighting element according to claim 1, wherein the waterproof electrical connector has a connector portion which is detachable from the waterproof lighting element.

3. The waterproof lighting element according to claim 1, further comprising a power source.

4. The waterproof lighting element according to claim 1, further comprising a reflector element attached to the cover element.

5. The waterproof lighting element according to claim 1, wherein the plurality of LED components comprises at least two subsets of LED components with different emission spectrums.

6. A method of manufacturing a waterproof lighting element, the method comprising:
providing a printed circuit board blank having an aluminum substrate layer, the printed circuit board further having a trace layer on a first side;
removing a portion of the trace layer from the first side, thereby forming a center section and a peripheral section on the first side, such that the center section has the trace layer and the peripheral section forms a closed loop shape without the trace layer around the center section;
forming an opening, the opening extending from the center section of the first side of the printed circuit board to an opposite second side of the printed circuit board;
mounting a plurality of light emitting diode (LED) components on the center section;
mounting a waterproof electrical connector through the opening, the waterproof connector being configured to provide a connection interface on the second side in order to form an electrical connection to the LED components;
providing an adhesive sealant on the peripheral section, the adhesive sealant being configured to form a closed loop shape corresponding with the closed loop shape of the peripheral section; and
mounting a transparent cover element made of tempered glass on the adhesive sealant on the first side so that the adhesive sealant attaches the cover element to the printed circuit board, thereby forming a waterproof structure sealing the LED components inside the waterproof structure.

* * * * *